United States Patent
Tsai et al.

(10) Patent No.: US 7,626,240 B2
(45) Date of Patent: Dec. 1, 2009

(54) ELECTRO-OPTICAL APPARATUS AND A CIRCUIT BONDING DETECTION DEVICE AND DETECTION METHOD THEREOF

(75) Inventors: Ying-Hung Tsai, Hsin-Chu (TW); Shih-Ping Chou, Hsin-Chu (TW); Ching-Yu Huang, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/114,084

(22) Filed: May 2, 2008

(65) Prior Publication Data

US 2008/0308894 A1    Dec. 18, 2008

(30) Foreign Application Priority Data

Jun. 15, 2007    (TW) .............................. 96121847 A

(51) Int. Cl.
*H01L 31/00* (2006.01)
(52) U.S. Cl. ................. 257/459; 257/48; 257/E31.001; 324/537; 324/754; 324/765; 438/11; 438/14; 438/17; 438/18
(58) Field of Classification Search ................. 257/459, 257/48; 438/11, 14–18; 324/537, 754, 765
See application file for complete search history.

(56) References Cited

U.S. PATENT DOCUMENTS 7,074,704 B2    7/2006    Kwon et al.

2008/0006952 A1 *    1/2008    Lee et al. ..................... 257/797

FOREIGN PATENT DOCUMENTS

JP    04-060472    2/1992
JP    2005-227217    8/2005

OTHER PUBLICATIONS

English language translation of abstract of JP 04-060472.
English language translation of abstract of JP 2005-227217.

* cited by examiner

*Primary Examiner*—Lynne A. Gurley
*Assistant Examiner*—Naima J Kearney
(74) *Attorney, Agent, or Firm*—Thomas, Kayden, Horstemeyer, Risley

(57) ABSTRACT

This invention provides a circuit bonding detection device, a detection method thereof and an electro-optical apparatus incorporating the circuit bonding detection device. The circuit bonding detection device includes a substrate, a circuit module, a set of sensors, and a detection unit. A plurality of contact pads is disposed on the substrate. The circuit module includes a plurality of conductive bumps corresponding to the contact pads. The sensors are disposed on two sides of at least one of contact pads or of the corresponding conductive bumps. The detection unit is electrically coupled with the set of sensors and transmits a fault signal when at least one of the contact pads and the corresponding conductive bumps deforms and contacts the sensors.

29 Claims, 15 Drawing Sheets

ELECTRO-OPTICAL APPARATUS AND A CIRCUIT BONDING DETECTION DEVICE AND DETECTION METHOD THEREOF

BACKGROUND OF THE INVENTION

1. Field of the Invention

This present invention relates to a circuit bonding detection device, a detection method thereof and an electro-optical apparatus incorporating the circuit bonding detection device. More particularly, the present invention relates to a display panel circuit bonding detection device, detection method thereof and a display panel incorporating the display panel circuit bonding detection device and the detection method thereof.

2. Description of the Prior Art

The advance in display panel technology drives the demand for technology development in the packaging of display panel driver IC (Integrated Circuit). The conventional IC (Integrated Circuit) package method in the TFT-LCD (Thin-Film Transistor Liquid Crystal Display) includes TAP (Tape Carrier Package), COF (Chip On Film), and COG (Chip On Glass), wherein the package method of COG (Chip On Glass) has the advantages of lower cost, simplicity in manufacture processes and high precision, and thus gradually becomes a widely used driver IC package method.

FIG. 1 is the perspective diagram illustrating the conventional COG package method. A conductive pad 11 is disposed on the glass substrate 10 and is electrically coupled to thin film transistors (TFTs) of the glass substrate 10. The driver circuit on a chip 30 has conductive bumps 31 electrically coupled to the conductive pad 11. A bonding material layer 20 having conductive particle 22 such as ACF (Anisotropic Conducive Film) is disposed between the conductive pads 11 and the conductive bumps 31. The chip 30 is mounted on top of the glass substrate 10, and thus the conductive pad 11 can electrically communicate with the conductive bump 31 via the bonding material layer 20 disposed between conductive pads 11 and conductive bumps 31.

As for all the IC package method including the COG, the precision in aligning the chip 30 with the circuit of the glass substrate 10 and the test of indentation after mounting are important in the improvement of the manufacture process. As FIG. 1 shows, events such as over-stress or uneven thickness of a base 33 of the chip 30, often causes the conductive bump 31 to deform, and increases the occurrence of defective product. The process of sifting the defective product is normally executed by personnel through inspection. However, the sifting for defective product may create non-coherence in the production process and there still exists the risk of failed scrutiny.

SUMMARY OF THE INVENTION

It is an objective of the present invention to provide a circuit bonding detection device and a detection method thereof to replace artificial inspection with automated detection.

It is another objective of the present invention to provide a circuit bonding detection device and a detection method thereof to reduce the cost and difficulty in circuit assembly.

It is another objective of the present invention to provide a circuit bonding detection device and a detection method thereof to reduce the possibility of failed scrutiny of defects.

It is another objective of the present invention to provide a display device with a lower overall cost.

The circuit bonding detection device of the present invention includes a substrate, a circuit module, a set of sensors and a detection unit. A plurality of contact pads is disposed on the substrate. Within the contact pads, a first group is formed by at least one contact pad. The circuit module is disposed correspondingly on the substrate. The circuit module includes a plurality of conductive bumps and one conductive bump has a corresponding contact pad of the substrate. The sensors are disposed on two sides of at least one of the contact pads of the first group and the corresponding conductive bumps. The detection unit electrically couples with the sensors, wherein the detection unit transmits a fault signal in response to at least one of the contact pads of the first group and the corresponding conductive bump for deforming and making contact with at least one of the set of sensors.

The detection method of the present invention for the circuit bonding detection device includes disposing the sensors on two sides of at least one of the contact pads of the first group and the corresponding conductive bumps, mounting the circuit module on the substrate and electrically coupling the contact pads of the substrate with the conductive bumps of the circuit module and detecting the set of sensors in order to determine possible deformation in at least one of the contact pads and the corresponding conductive bumps. The detection unit will transmit a fault signal when it detects that a deformation occurs in at least one of the contact pads and the corresponding conductive bumps.

BRIEF DESCRIPTION OF THE DRAWINGS

FIG. 9b is the perspective view of a variation embodiment of the seventh embodiment illustrated in FIG. 9a;

DETAILED DESCRIPTION OF THE INVENTION

The present invention provides a circuit bonding detection device, a detection method thereof, and an electro-optical apparatus incorporating the device and the detection method thereof. The embodiments of the present invention are preferred to be used to test circuits processed by COG (Chip On Glass) process and as an exemplary explanation. However, in different embodiments, the present invention can also be used for test in circuits processed by the COF (Chip On Film) process and TCP (Tape Carrier Package) process or other similar circuit processes. The ACF (Anisotropic Conducive Film) is preferred to be used as the main bonding material for the COG and COF processes. However, in other embodiments, material such as solder and adhesive tape can also be used as bonding material. Furthermore, all embodiments described in the following sections use one of many sides of each component for the demonstration of the present invention, but are not limited thereto; the present invention can still be selectively applied on every side of each component for the following embodiments.

Figure 1:
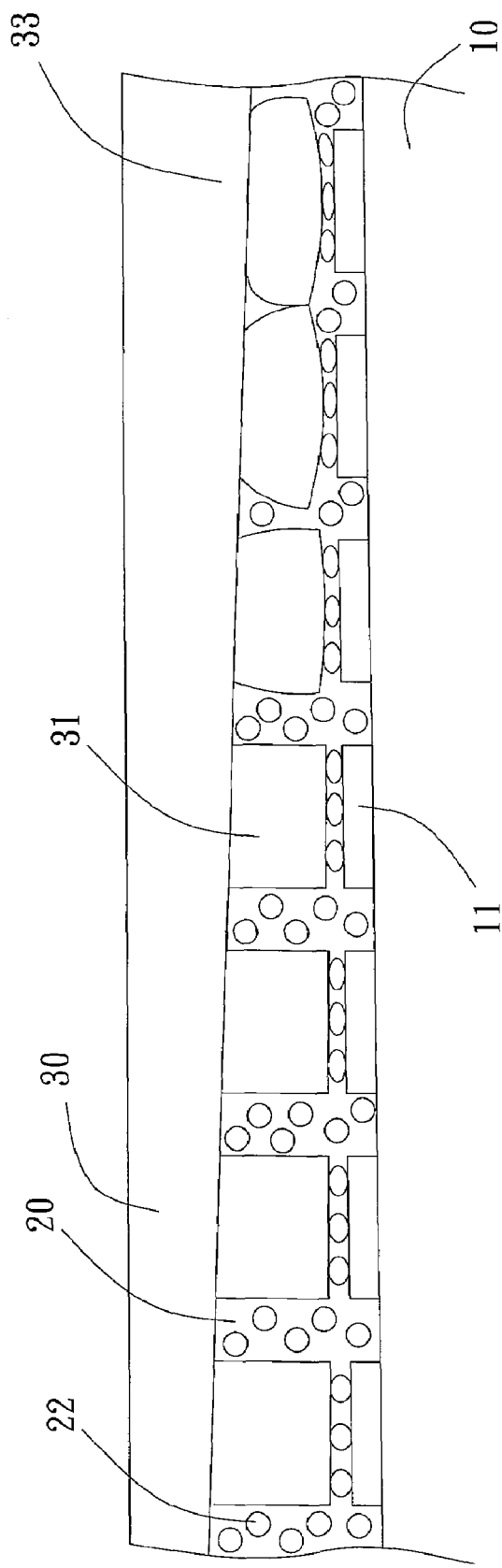
FIG. 1 is a perspective view illustrating a circuit of the conventional liquid crystal display panel during mounting.
Figure 2:
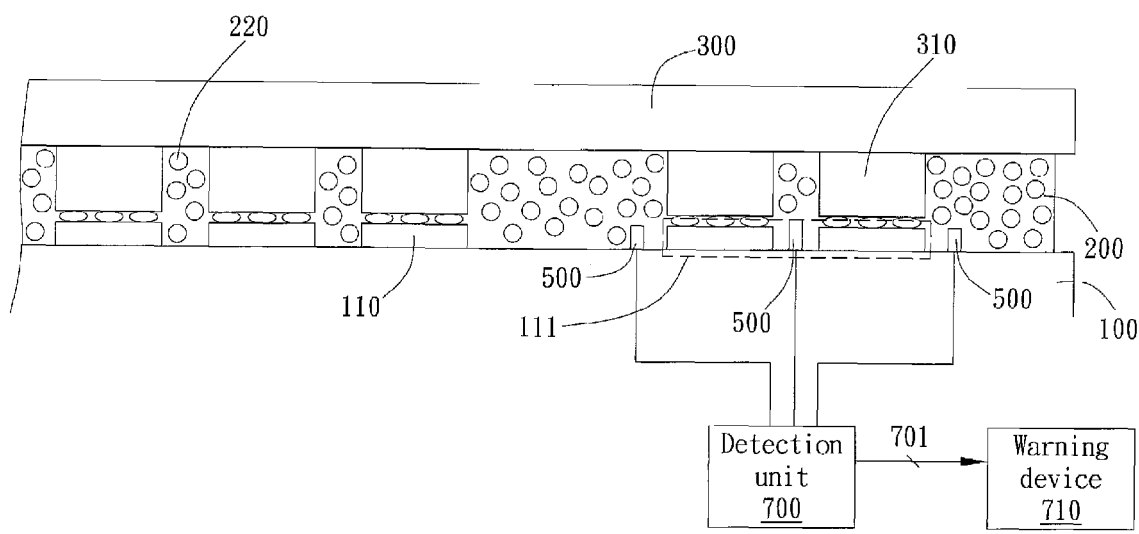
FIG. 2 is a cross-sectional view of the first embodiment of a circuit bonding detection device of the present invention.

The circuit bonding detection device of the present invention includes a substrate 100, a circuit module 300, a set of sensors 500, and a detection unit 700. In the first embodiment shown in FIG. 2, a plurality of contact pads 110 is disposed on the substrate 100, the contact pads 110 can be arranged in patterns such as juxtaposed pattern, delta pattern, or other suitable patterns. Furthermore, as FIG. 2 shows, a first group 111 is formed by at least one contact pad 110. The contact pad 110 is electrically coupled with the TFTs (thin-film transistors) of the substrate 100 or is electrically coupled with other circuits used for signal transmission. The substrate 100 can be made of flexible materials (such as rubber, polyacetyl group, polyalcohol group, polyester group, thermosetting polymer, thermoplastic polymer, or other suitable polymers, or combinations thereof, opaque materials (such as silicon chip, ceramics, or other suitable materials), or transparent materials (such as glass, quartz, or other suitable materials). In the present embodiment shown in FIG. 2, the material of substrate 100 is composed of glass but is not limited thereto. The composition material of the contact pad 110 includes reflective material (such as gold, silver, copper, iron, tin, lead, cadmium, tungsten, titanium, tantalum, neodymium, aluminum, molybdenum, hafnium, other suitable metals, alloy of the above-mentioned metals, nitride of the above-mentioned metals, oxide of the above-mentioned metals, nitrogen oxide of the above-mentioned metals, or combinations thereof, transparent material (such as indium tin oxide, aluminum zinc oxide, indium zinc oxide, cadmium tin oxide, other suitable compound, or combinations thereof), nonmetal material (such as material containing single crystal silicon, material containing polycrystalline silicon, material containing microcrystalline silicon, material containing amorphous silicon, material containing germanium, other suitable material, or combinations thereof), or combinations thereof.

The circuit module 300 is disposed correspondingly on the substrate 100. A plurality of conductive bumps 310 is disposed on the circuit module 300. Each conductive bump 310 corresponds to one contact pad 110 on the substrate 100 and thus the distribution pattern of conductive bumps 310 is preferred to correspond to that of the conductive pads 110. Conductive bump 310 and the corresponding contact pad 110 are preferred to electrically communicate or couple with each other via the bonding material 200 disposed between them. The bonding material 200 is preferred to include joining material having or not having conductive particles 220, such as ACF (Anisotropic Conducive Film) or other suitable polymer. The present invention uses the ACF containing conductive particles 220 as the bonding material 200. However, in different embodiments, the bonding material 200 may be replaced by other materials (such as solder, tape, or other suitable materials). The conductive bumps 310 are preferred to be made of conductive metals such as gold, silver, and copper etc. The circuit module 300 includes an integrated circuits (such as chips or other components), printed circuit board, flexible circuit board, modules including other substrates, or combinations thereof. The present embodiment uses integrated circuits such as a microchip as the circuit module 300, but is not limited thereto.

Figure 3:
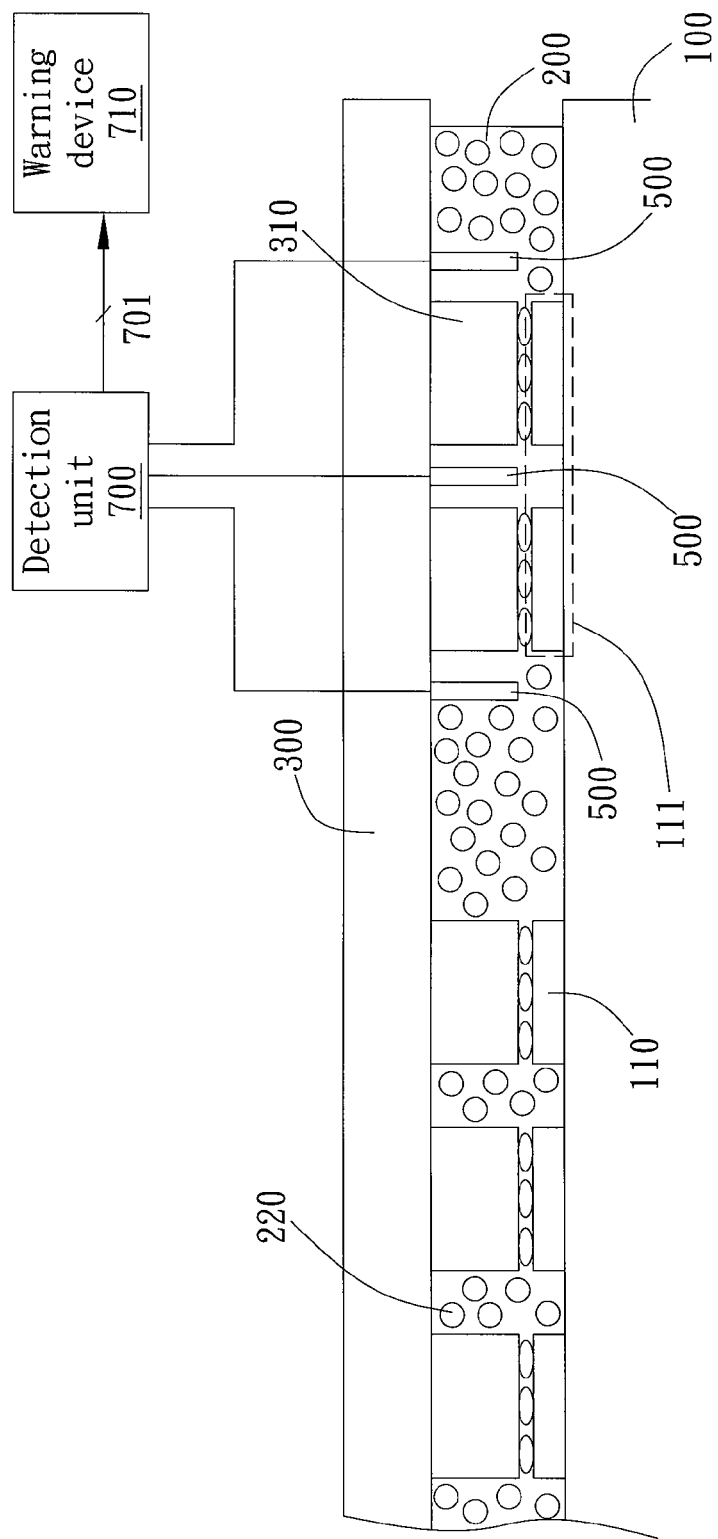
FIG. 3 is a cross-sectional view of the variation embodiment of the first embodiment illustrated in FIG. 2.

In the first embodiment shown in FIG. 2, the sensors 500 are each disposed on two lateral sides of the contact pads 110 of the first group 111 as an example, but are not limited thereto and can be selectively modified in different embodiments. In a variation embodiment of the first embodiment shown in FIG. 3, the set of sensors 500 are disposed on the circuit module 300, or can be disposed on both the substrate 100 and the circuit module 300. The distance between the set of sensors 500 and lateral side of the adjacent contact pads 110 may be varied depending on the design; in the embodiments of the present invention, the distance between the set of sensors 500 is preferred to be substantially greater than or substantially equal to 2 micrometers, but is not limited thereto. With more precise circuitry design, the said distance can be adjusted or further decreased. The set of sensors 500 disposed on two lateral sides of the contact pads 110 transmit different signals. In the present embodiment, one sensor 500 on one lateral side of the contact pad 110 transmits a ground signal Vg while the other sensor 500 on the other lateral side of the sensor 500 transmits a common signal Vcom, such as the exemplary common signal from the circuitry on the substrate 100 but is not limited thereto. The two different signals can be provided by the other circuits of the substrate 100, the circuit module 300, other signal sources or a voltage, or combinations thereof.

The detection unit 700 respectively couples with sensors 500, in order to detect a signal from the set of sensors 500 or a variation in the signal. The detection unit 700 coupled with the circuit bonding detection device selectively includes firmware module, software module, hardware module, or combinations thereof. Preferably, the detection unit 700 couples with a warning device 710 in order to facilitate the artificial inspection for signaling a fault, but is not limited thereto, can be not used with the warning device 710 or used other device. The warning device 710 includes a display panel, a loudspeaker, a spreadsheet generator, other devices, or combinations thereof. The form of warning includes a prompt on the display panel, a warning sound, a spreadsheet, other patterns, or combinations thereof. When the contact pad 110 of the first group 111 or the corresponding conductive bump 310 deforms due to mounting and makes contact with any one of the sensors 500; the detection unit 700 will then detect this deformation via the another signal from the sensors 500 or the signal in the sensors 500. Furthermore, if contacts are made with two sensors 500 disposed on both lateral sides of the contact pad 110, the detection unit 700 will still be able to detect the deformation. In order to facilitate the detection or the identification of deformation in the contact pad 110 or in the conductive bump 310, it is preferred to preset a certain deformation limit of the contact pad 110 and/or the conductive bump 310 along the same dimension (such as horizontal dimension) as a deformation tolerance limit. When a contact occurs between the contact pad 110 and/or the conductive bump 310 and the sensor 500, it is preferred to detect a deformation substantially greater than or substantially equal to 50% of the original size. However, this deformation tolerance limit can be adjusted according to the sizes of the contact pads 110 and that of the conductive bump 310, spacing between the contact pads 110 and that of the conductive bump 310 or the depth of mounting. For instance, the deformation tolerance level can be decreased to be about 12.5% or increased to about 80% of the original size.

Once the detection unit 700 detects a signal variation in the sensor 500, the detection unit 700 will then transmit a fault signal 701 to instruct the warning device to send out a warning. In order to facilitate the detection of fault signal 701, the signal variation or namely signal difference occurred after the contact pad 110 and/or the conductive bump 310 makes contact with the sensor 500 is preferred to be an absolute signal variation or namely an absolute signal difference, but is not limited thereto. The signal variation can also be determined from the difference in original signals before and after contact.

Figure 4A:
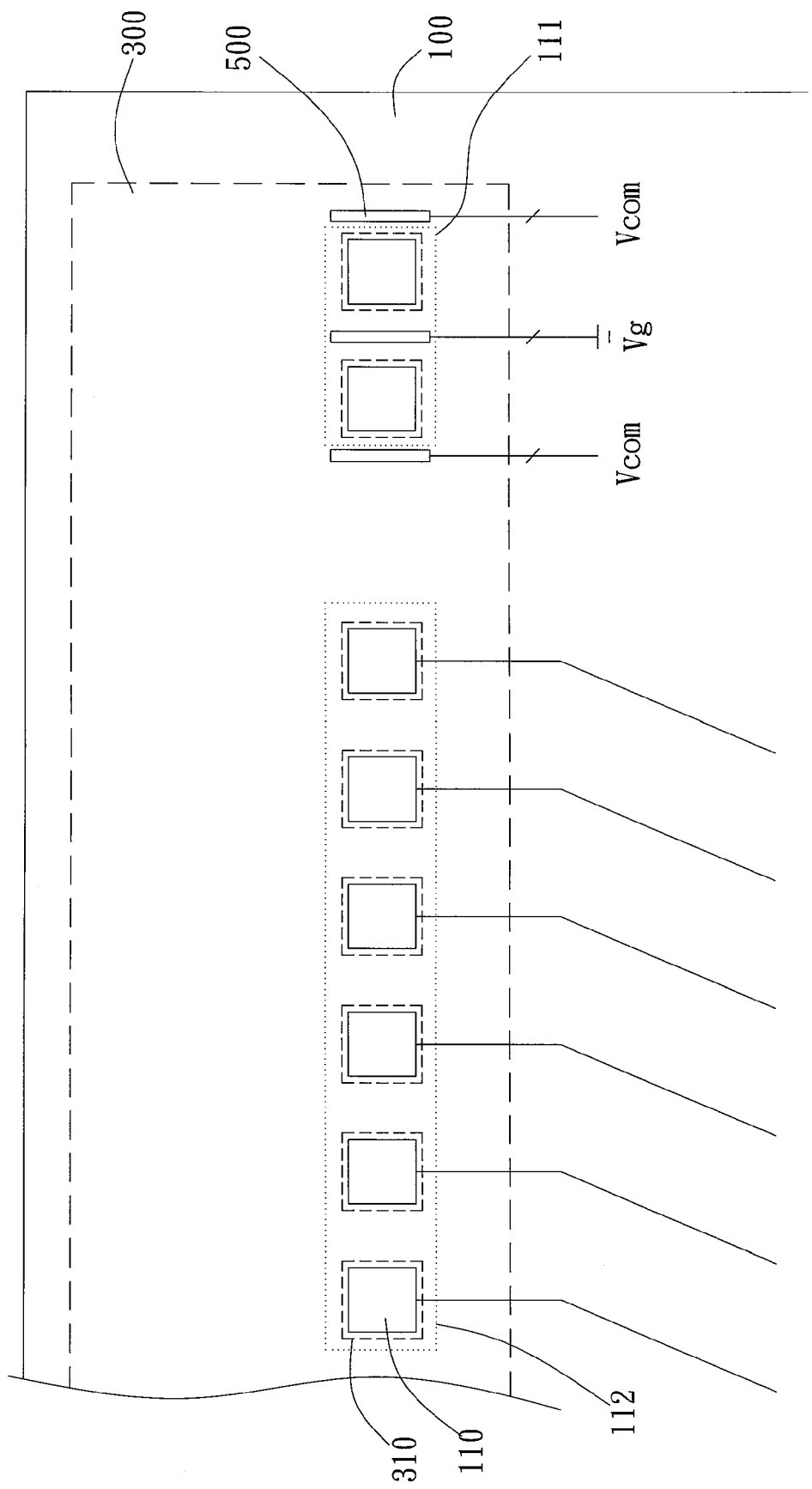
FIG. 4a is the top view of the second embodiment, wherein contact pads of the first group are disposed at the outside of the contacts pads of the second group.

In the second embodiment shown in FIG. 4a, all contact pads 110 disposed on the substrate 110, may further include a second group 112 formed by a plurality of contact pads 110. As for the present embodiment, the first group 111 includes at least two contact pads. However, in different embodiments, the first group 111 can include one or more contact pads 110, such as one, two, three, fourth, five, or six contact pads etc. As FIG. 4a shows, when the first group 111 includes two adjacent contact pads 110, three sensors 500 can be each disposed in the middle of the two contact pads 110 and on two sides of the first group 111 and thus three sensors 500 are disposed in the first group 111. However, in different embodiments, the first group 111 may have two sensors 500 disposed on two sides of each contact pads 110, and thus two independent sensors 500 will be disposed between the two adjacent contact pads 110.

Moreover, the contact pads 110 of the first group 111 are disposed at the outside of the second group 112. The contact pads 110 of the first group 110 are preferred to be used as alignment contact pads dummy contact pads, or contact pads not for the purpose of signal transmission; and the contact pads 110 of the second group 112 are used for signal transmission within circuit. However, the above-mentioned configuration can be selectively modified. Similarly, the conductive bumps 310 of the circuit module 300 corresponding to the contact pads 110 can be separated into a first group and a second group in order to couple electrically with the contact pads 110. Furthermore, the contact pads 110 of the first group 111 and the contact pads 110 of the second group 112 are preferred to be arranged along the same direction and are separated with spacing substantially greater than the spacing between adjacent contact pads 110 of the same group. However, this arrangement direction, distribution pattern, and spacing can be modified in different embodiments.

Figure 4B:
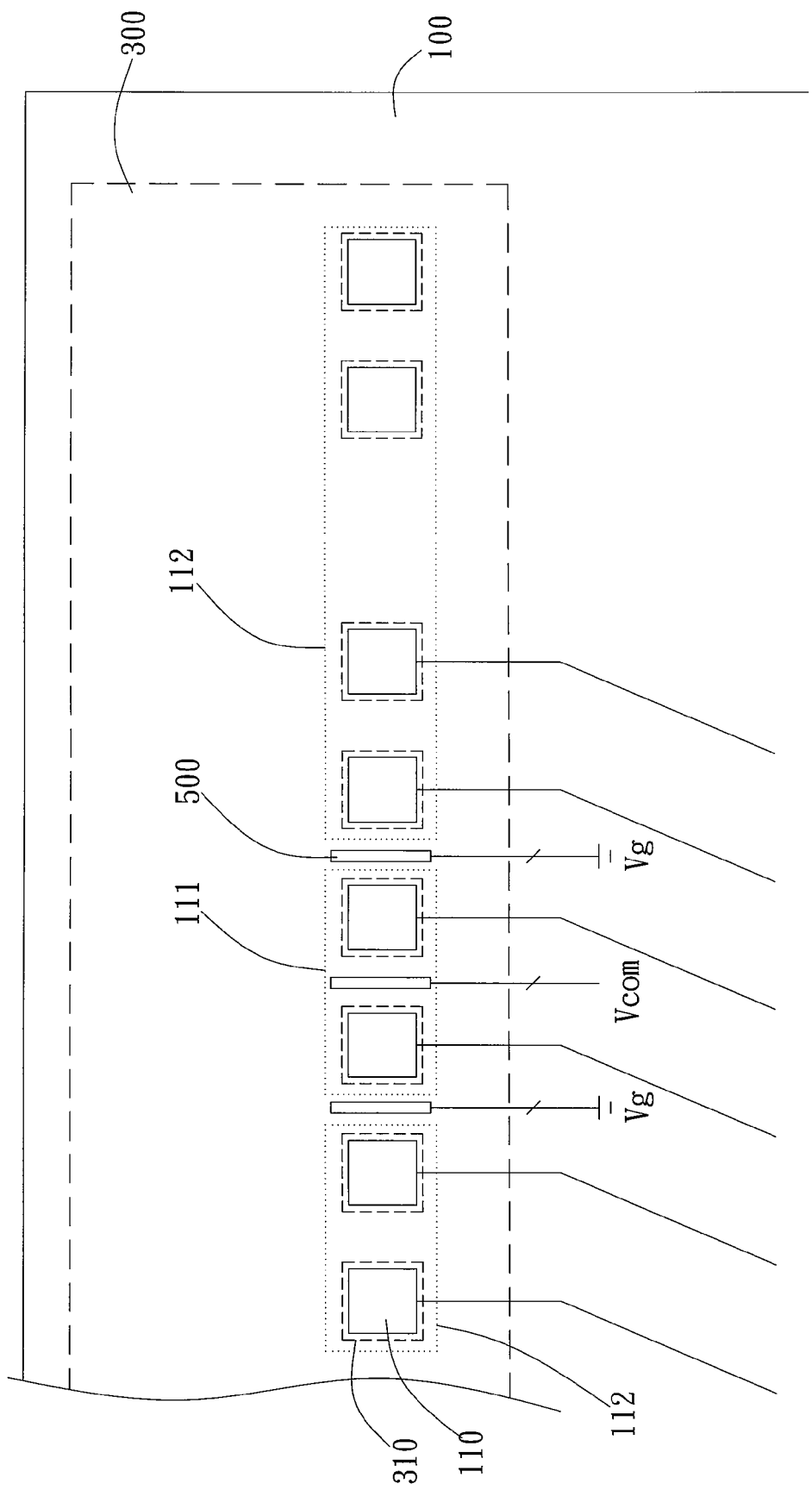
FIG. 4b is the top view of the variation embodiment of the second embodiment illustrated in FIG. 4a, wherein contact pads of the first group are disposed between the contact pads of the second group.

An embodiment shown in FIG. 4b is a variation of the second embodiment shown in FIG. 4a. In this variation embodiment, the contact pads 110 of the first group 111 are disposed between the contact pads 110 of the second group 112. In other words, the contact pads 110 of the first group 111 and the contact pads 110 of the second group 112 are mixed. In this arrangement, the contact pads 110 of the first group 111 and the second group 112 are both preferred to be used for signal transmission. In this variation embodiment, the set of sensors 500 are disposed on two lateral sides of the contact pads 110 of the first group 111 but not on the lateral sides of the contact pads 110 of the second group 112. Similarly, the conductive bumps 310 can be divided into a first group and a second group to electrically couple with the contact pads 110.

Figure 4C:
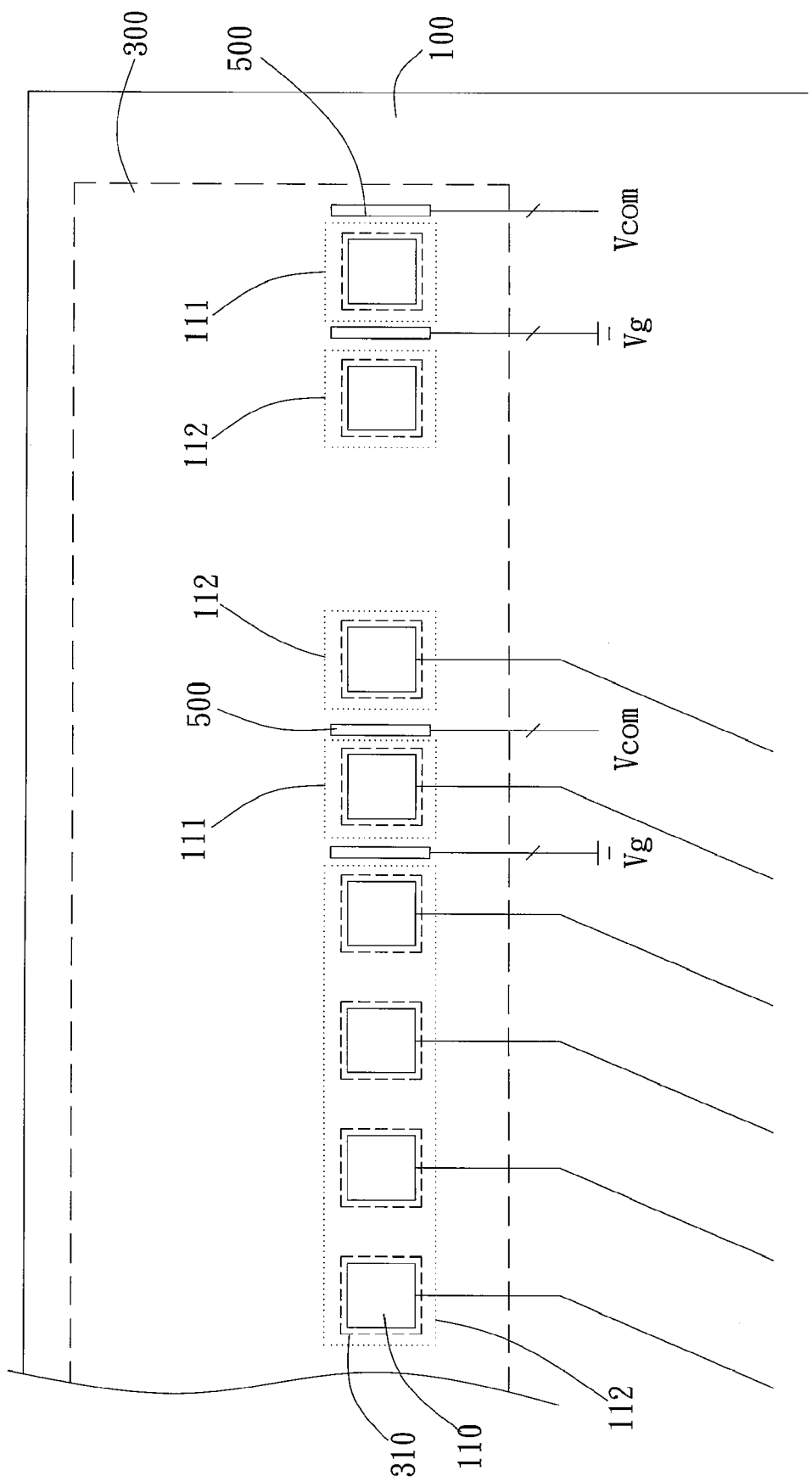
FIG. 4c is the top view of the variation embodiment of the second embodiment illustrated in FIG. 4a, wherein part of the contact pads of the first group are disposed at the outside of contact pads of the second group.

An embodiment shown in FIG. 4c is another variation of the second embodiment shown in FIG. 4a. In this variation embodiment, part of the contact pads 110 of the first group 111 are disposed between the contact pads 110 of the second group 112, and part of the contact pads 110 of the first group 111 are disposed at an outside of the second group. Similarly, the conductive bumps 310 can be separated into a first group and a second group to electrically couple with the contact pads 110. This configuration facilitates the monitoring of bonding condition between contact pads 110 and conductive bumps 310.

Figure 5A:
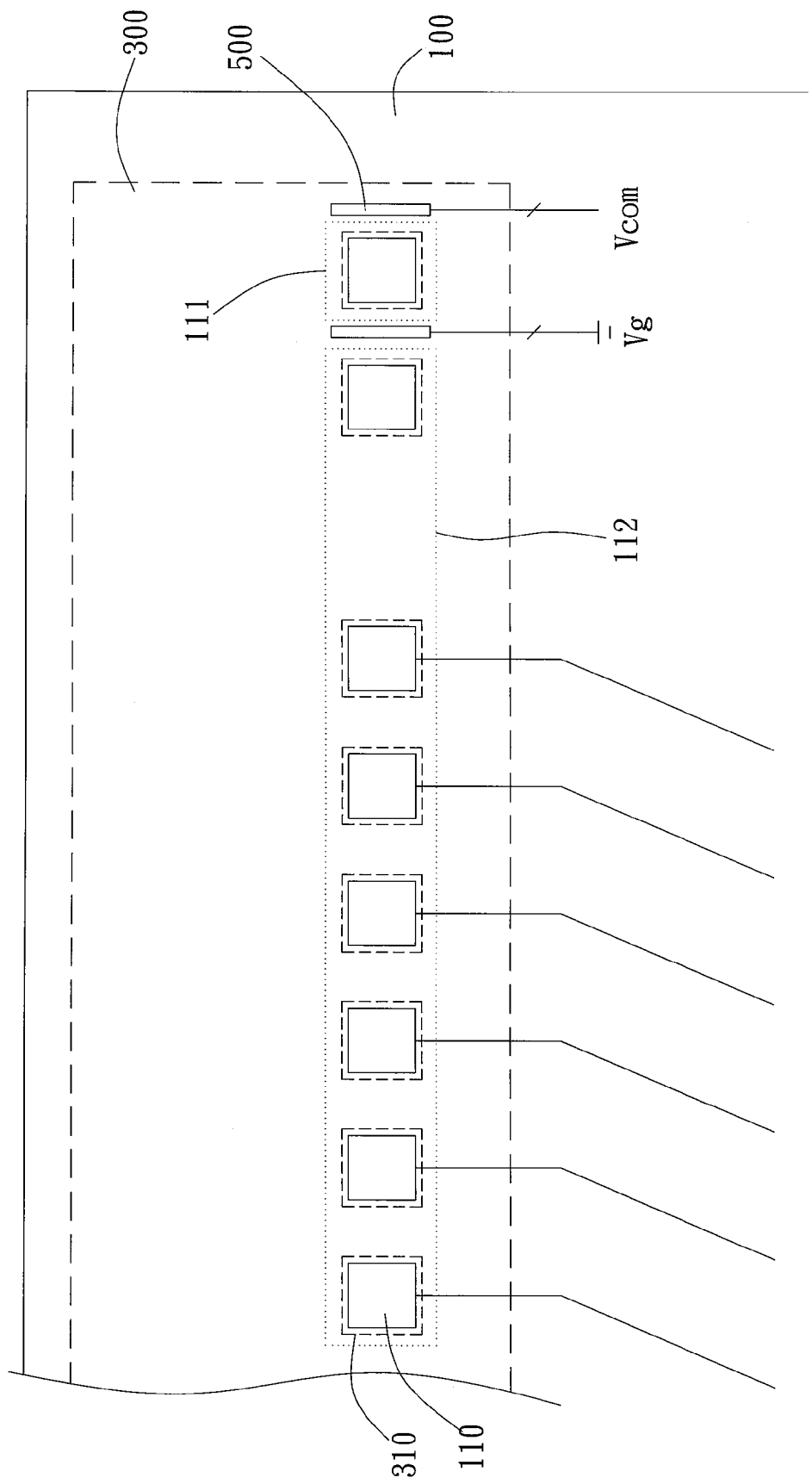
FIG. 5a is the top view of the third embodiment, wherein the first group is formed by a single contact pad.

In the third embodiment shown in FIG. 5a, the first group 111 includes a single contact pad 110. One sensor 500 is disposed on two sides of the contact pad 110 respectively. The contact pad 110 of the first group 111 is disposed at the outside of the second group 112, but is not limited thereto. The sensors 500 can be disposed at the outside of the first group 111 having at least two contact pads 110. It is preferred for the first group 111 to be an alignment contact pad, a dummy contact pad, or contact pads not for signal transmission. The contact pads 110 of the second group 112 include the contact pad for signal transmission, alignment contact pad, dummy contact pad or contact pads not for signal transmission. Similarly, the conductive bumps 310 can be separated into a first group and a second group to electrically couple with the contact pads 110.

Figure 5B:
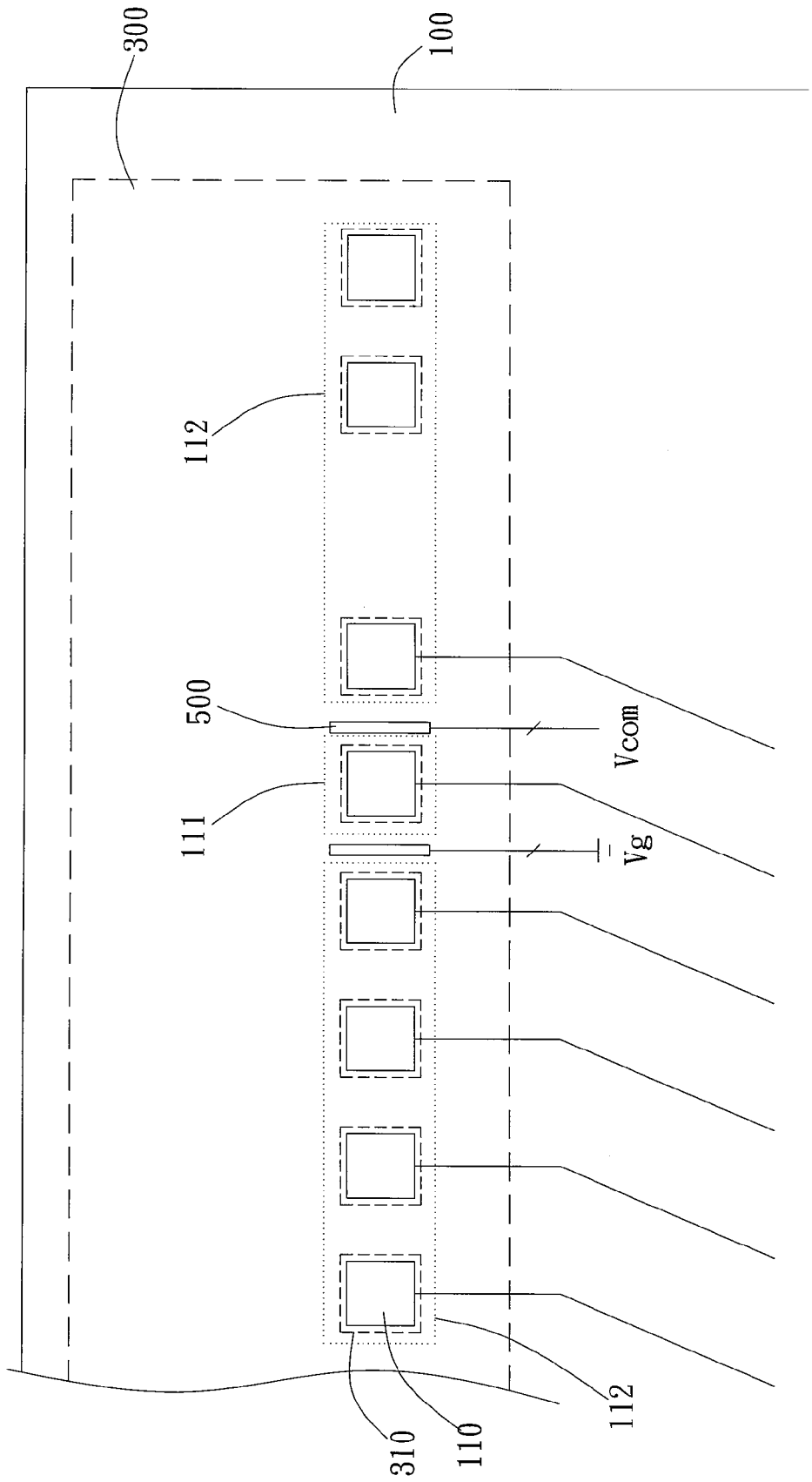
FIG. 5b is a variation embodiment of the third embodiment illustrated in FIG. 5a, wherein the first group is formed by a single contact pad.

An embodiment shown in FIG. 5b is the variation of the third embodiment shown in FIG. 5a. In this variation embodiment, the first group 111 includes a single contact pad 110 and is disposed between the contact pads 110 of the second group 112. In other words, sensors 500 are disposed on two lateral sides of a chosen contact pad 110 of the second group 112. The chosen contact pad 110 of the second group 112 then becomes the contact pad 110 of the first group 111, but is not limited thereto. The first group 111 can also include at least two contact pads 110, and can be disposed between contact pads 110 of the second group 112, with sensors 500 disposed on lateral sides of the contact pads 110 of the first group 111. The contact pads 110 of the first group 111 and the second group 112 are preferred to include contact pads 110 for signal transmission, but are not limited thereto. The first group 111 and the second group 112 can also have contact pads not for signal transmission (such as an alignment contact pad, a dummy contact pad, or others). Consequently, in this variation embodiment, the set of sensors 500 are disposed on two lateral sides of contact pads 110 of the first group 111 but not on two lateral sides of contact pads 110 of the second group 112. Similarly, the conductive bumps 310 can be separated into a first group and a second group to electrically couple with the contact pads 110.

Figure 6:
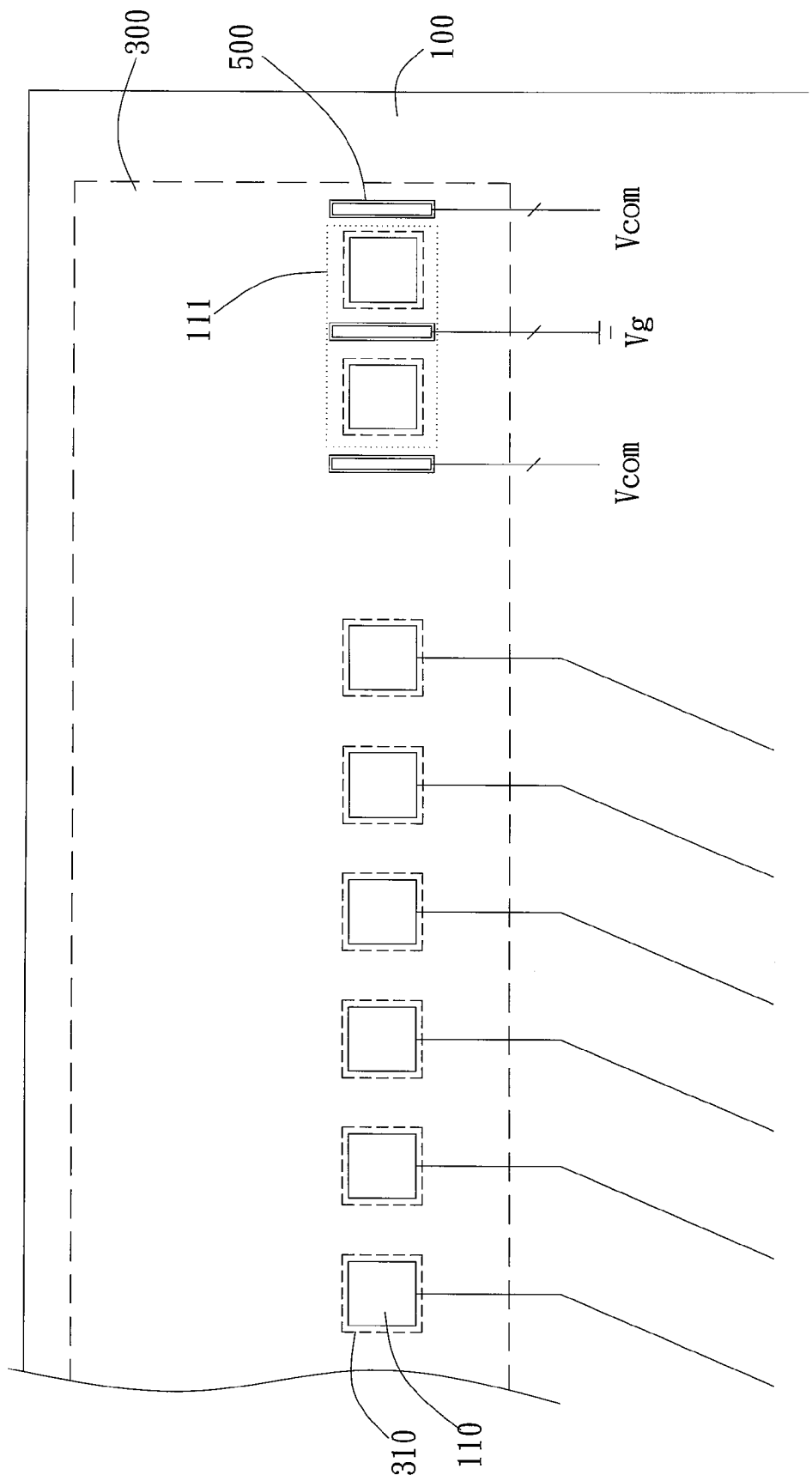
FIG. 6 is the perspective view of the fourth embodiment of the present invention.

Furthermore, in the embodiments shown in FIG. 4a, FIG. 4b, FIG. 4c, FIG. 5a and FIG. 5b, the sensor 500 is a circuit with a linear pattern, but is not limited thereto. The set of sensors 500 in the fourth embodiment shown in FIG. 6 may include a circuit with a rectangular pattern, other patterns, or combinations thereof. The patterns of the sensor 500 can first be rectangular and then linear, or can first be linear, then rectangular, and finally linear. Furthermore, the present embodiment may adopt the pattern or designed norms in the above-mentioned embodiments.

In the embodiments shown in FIG. 4a, FIG. 4b, FIG. 4c, FIG. 5a and FIG. 5b, an integrated circuit is used as an exemplary circuit module 300 and is coupled with the substrate 100. The conductive bumps 310 of the circuit module 300 couples electrically with the contact pads 110 on the substrate 100 via a bonding material 200. However, in different embodiments, the circuit module 300 may include a flexible substrate (such as flexible printed circuit, thermoplastic polymer, thermosetting polymer, or combinations thereof), rigid substrate (such as printed circuit board, ceramics, or other materials), or combinations thereof. The said substrate is able to selectively include or not to include a driver circuit such as an integrated circuit.

Figure 7:
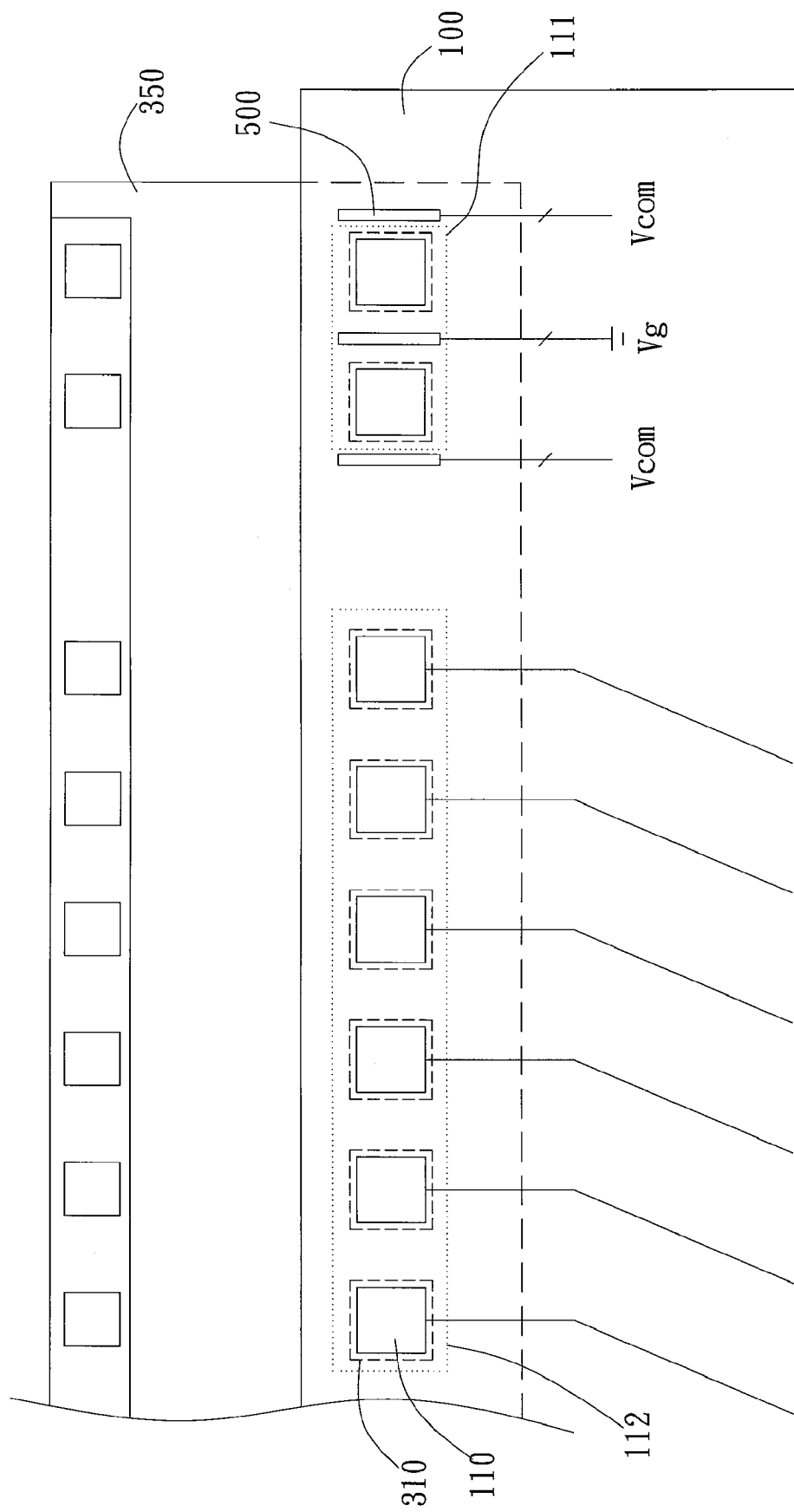
FIG. 7 is the top view of the fifth embodiment, wherein the circuit module includes a flexible base or a rigid base.

In the fifth embodiment shown in FIG. 7, the circuit module 300 uses the flexible circuit board 350 as base, wherein the flexible circuit board 350 is able to selectively include or selectively not to include the driver circuit such as an integrated circuit. The contact pads 110 of the first group 111 are disposed at the outside of contact pads 110 of the second group 112. The conductive bumps 310 corresponding to the contact pads 110 can be separated into a first group and a second group to electrically couple with the contact pads 110. Furthermore, the variation embodiment of the fifth embodiment can also adopt the configuration of the above-mentioned embodiments, such as staggering the contact pads 110 of the first group 111 amongst the contact pads 110 of the second group 112. The conductive bumps 310 are disposed corresponding to the contact pads 110 in order to establish an electrical coupling. However, in the fifth embodiment shown in FIG. 7, the flexible circuit board 350 can be replaced with rigid substrate such as printed circuit board. The printed circuit board is able to selectively include or not to include the driver circuit (such as integrated circuits with chips installed). It should be noted that the circuit bonding detection device is not limited to the only use in detection on coupling condition between the flexible circuit board 350 and contact pads 110 of the substrate 100. The device can also be selectively used in detection on coupling condition between the flexible circuit board 350 with the contact pads 110 of other devices, or on coupling condition between the contact pads 110 of the substrate 100 with circuit boards 300 of other forms.

Figure 8:
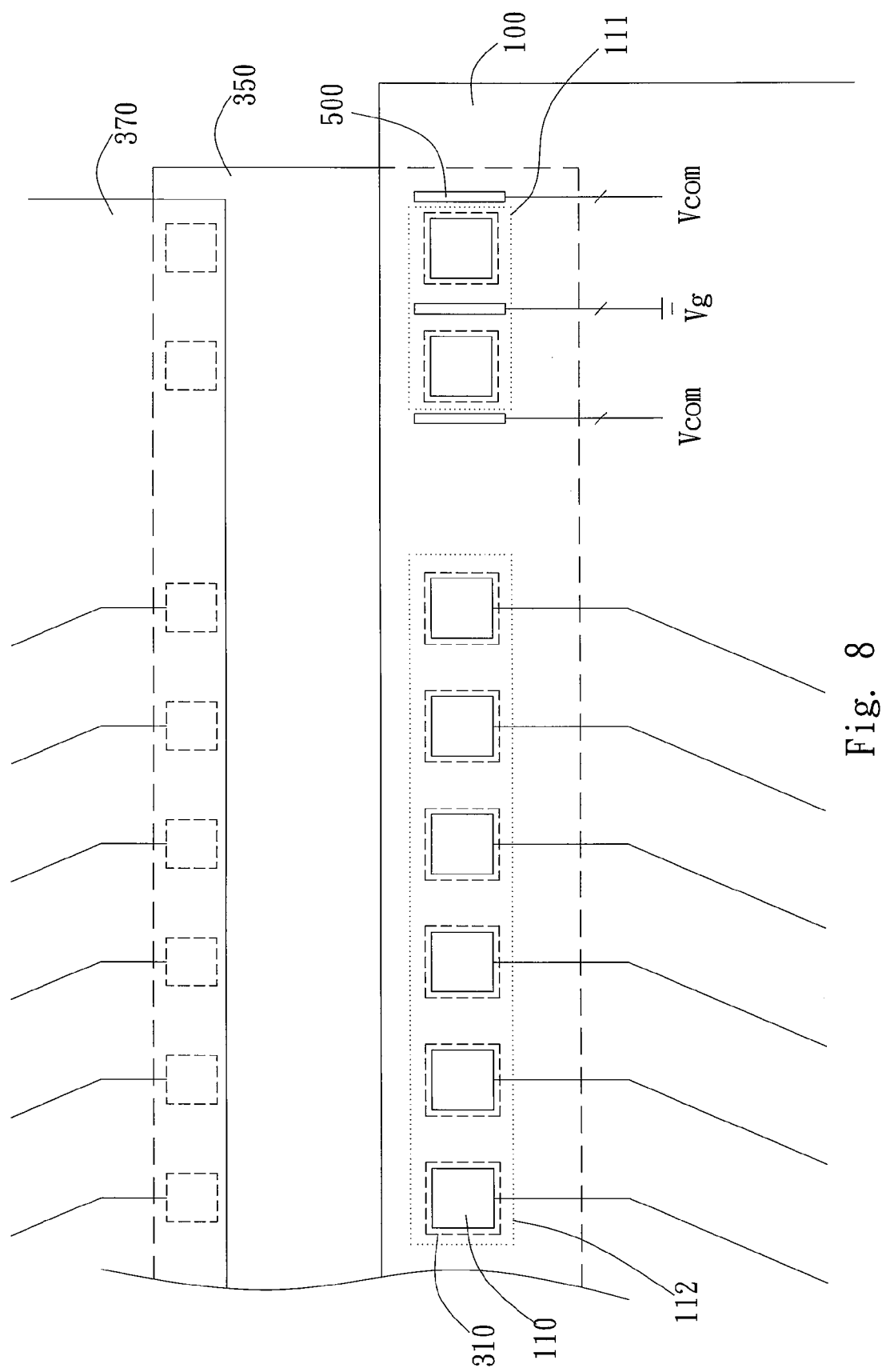
FIG. 8 is the top view of the sixth embodiment, wherein the circuit module includes a flexible base and a rigid base.

However, the circuit module 300 can also simultaneously include a flexible substrate and a rigid substrate. As for the sixth embodiment shown in FIG. 8, the circuit module 300 can include both the flexible circuit board 350 and the printed circuit board 370. The printed circuit board 370 couples with the flexible circuit board 350; and at least one of the flexible circuit board 370 and the printed circuit board 350 is able to selectively include or not to include the driver circuit such as an integrated circuit. Contact pads 110 of the first group 111 are disposed at the outside of contact pads 110 of the second group 112. The conductive bumps 310 corresponding to the first group 111 can also be divided into a first and a second group to electrically couple with the contact pads 110. The variation embodiment of the sixth embodiment can also use the configuration described in the above-mentioned embodiments, such as staggering the contact pads 110 of the first group 111 between the contact pads 110 of the second group 112. The conductive bumps 310 are disposed to electrically couple with the contact pads 110. It should be noted that the circuit bonding detection device is not limited to the only use in test of bonding condition between the flexible circuit board 350 and contact pads 110 of the substrate 100. The device can also be used selectively in detection on bonding condition between the flexible circuit board 350 with the printed circuit board 370, or bonding condition between the contact pads 110 on the other apparatuses with the printed circuit board 370.

Figure 9A:
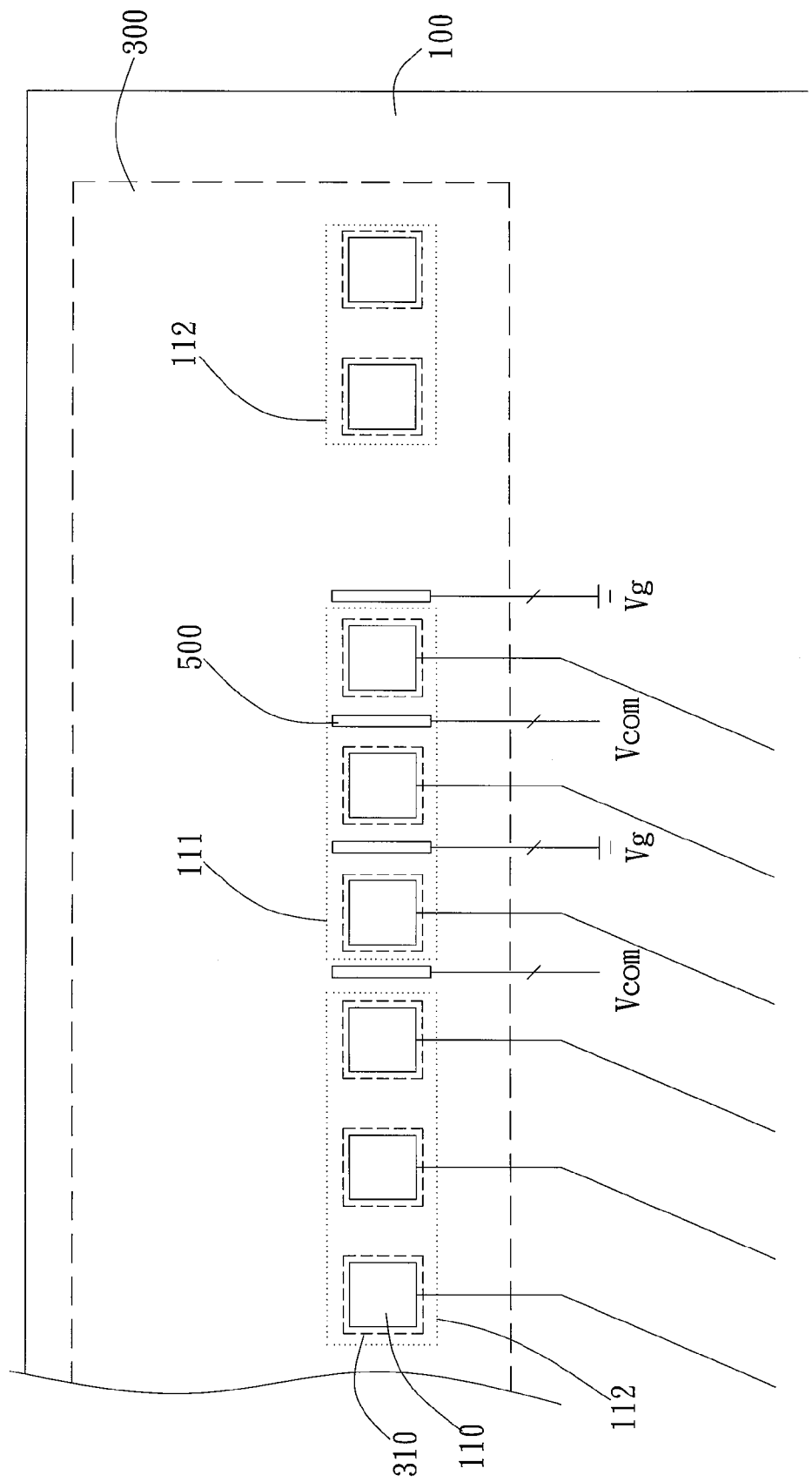
FIG. 9a is the perspective view of the seventh embodiment, wherein the first group consists of three contact pads.
Figure 9B:
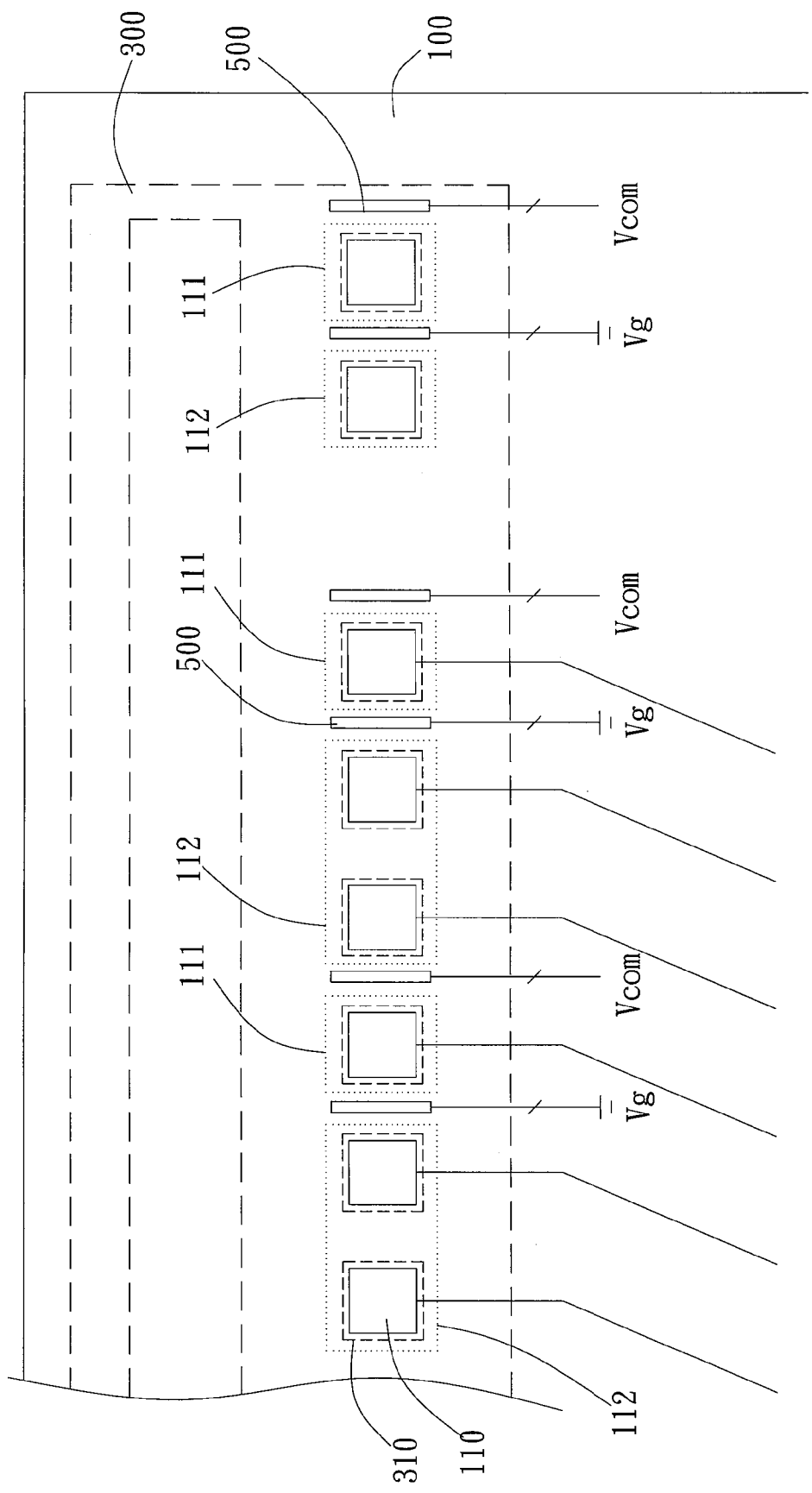

In the seventh embodiment shown in FIG. 9a, the first group 111 includes three adjacent contact pads 110. The set of sensors 500 are respectively disposed on two lateral sides of the first group 111 and between the other adjacent contact pads 110. In other words, three contact pads 110 of the first group 111 are staggered amongst four sensors 500. In the variation embodiment of the seventh embodiment shown in FIG. 9b, the contact pads 110 of the first group 111 are not adjacent to each other and thus two sensors are disposed on two lateral sides of each contact pad 110 of the first group 111.

Figure 10:
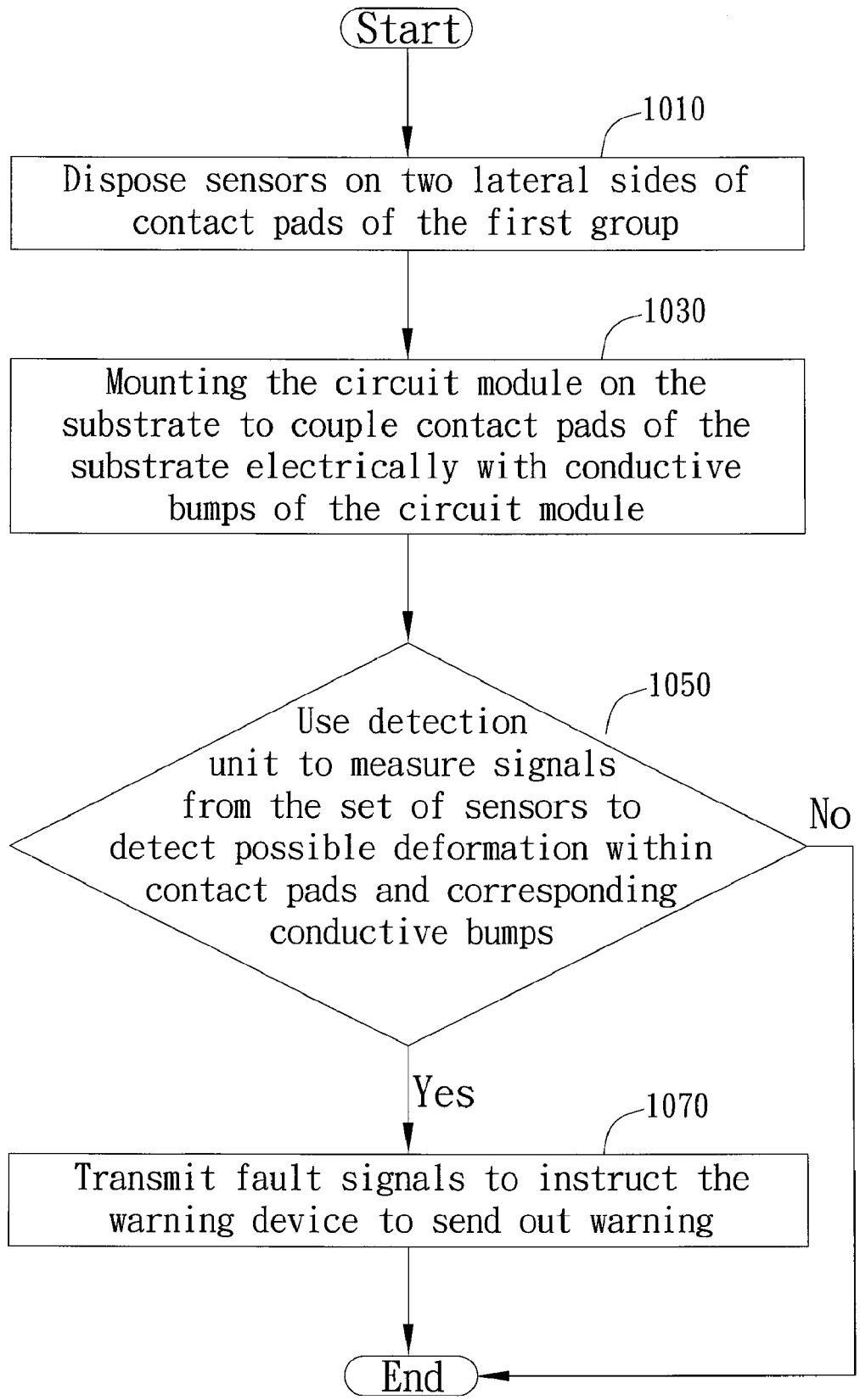
FIG. 10 is a flow chart of the circuit bonding detection method of the present invention.

The present invention also includes a detection method on circuit bonding condition. In the embodiment shown in FIG. 10, the step 1010 includes disposing the sensors 500 at two lateral sides of contact pads 110 of the first group 111. The bonding method of the sensor 500 includes semiconductor process such as thin-film circuit process, sputter process, photo process or etching process etc. Furthermore, the step 1010 also includes disposing the sensors 500 on two sides of the conductive bumps 310 of the circuit module 300, or disposing the sensors 500 on both components such as the substrate 100 and the circuit module 300.

A step 1030 includes mounting or pressing the circuit module 300 on the substrate 100 to electrically couple the contact pads 110 of the substrate 100 with the conductive bumps 310 of the circuit module 300. The step 1030 is preferred to include forming bonding material between the substrate 100 and the circuit module 300. The bonding material is preferred to include material having or not having conductive particles 220, such as ACF or other polymer. The bonding material 200 used in the present invention is ACF having conductive particles 220. However, in different embodiments, the ACF can be replaced with other material such as solder, adhesive tape, or other material. Furthermore, the step 1030 may also include aligning the contact pads 110 on the substrate 100 with the conductive bumps 310 on the circuit module 300, to prevent the malposition of the contact pads 110 and the conductive bumps 310 from occurring.

The step 1050 includes detecting the sensor 500 using the detection unit 700 to determine possible deformation within the contact pads 110 and/or the corresponding conductive bumps 310. After the mounting of circuit module 300, if contact pad 110 of the first group 111 and/or the corresponding conductive bump 310 makes contact with the sensor 500 due to deformation; the detection unit 700 will be able to detect this deformation through the transmission of a signal to and reception of other signals from the sensor 500. If contacts are made with two sensors 500 on both sides of the contact pad 110, the detection unit 700 will be able to detect the contact through the difference in the signal and the other signal. The sensor 500 on one side of the contact pad 110 is preferred to transmit a ground signal Vg while the sensor 500 on the other side of the contact pad 110 is preferred to transmit a common signal Vcom such as the common signal of the substrate 100. The transmitted signals from the sensors 500 can also be replaced with signals from circuit on the substrate 100, the circuit module 300, other signal sources or a voltage level. The sensor 500 will then transmit another signal to the detection unit 700 and the detection unit 700 will then determine whether that signal is substantially equal to the signal to the sensor 500. If contact pads 110 of the first group 111 and the corresponding conductive bumps 310 deform after mounting and make contact with the sensor 500, the signal received by the sensor 500 will be influenced and in turn affects the another signal to the detection unit 700. If the detection unit 700 finds that the another signal is different to the signal, it will then determine that a deformation occurs within the contact pad 110 or within the corresponding conductive bump 310.

Once the detection unit 700 has determined that a deformation has occurred within the contact pads 110 and/or within the corresponding bumps 310. The detection unit 700 will then proceed with the step 1070 by transmitting a fault signal for deformation identification. However, in order to facilitate fault signal identification of personnel, it is preferred for the detection unit 700 to transmit the fault signal to instruct the warning device 710 to send out a warning. In a more preferred embodiment, the fault signal is the signal variation (difference) between signals transmitted to and back from the sensor 500, when the contact pads 110 and/or the conductive bumps 310 make contact with the set of sensors 500. This fault signal is preferred to be an absolute signal difference (variation), but is not limited thereto. The fault signal can be determined from the difference in original signal. The warning device 710 includes a display panel, a loudspeaker, a spreadsheet generator, other devices, or combinations thereof. The warning includes a panel display, a warning sound, a spreadsheet, other types of warning, or combinations thereof.

Furthermore, the substrates 100 described in the above-mentioned embodiments of the present invention are the substrate 100 used in the display panel. The substrate 100 can be selectively varied in accordance with the design requirements, the application fields and different substrate material. Furthermore, the contact pad 110 and the conductive bump 310 used in the embodiments of the present invention are all disposed on one specific side of components such as the substrate 100, circuit module 300, and flexible circuit board 350 etc. The present invention can selectively utilize all sides of each component, and thus at least one side of each component (such as substrate 100, circuit module 300, and flexible circuit board 350) has the design of the present invention disposed on it. The signals transmitted by the sensor 500 of the present invention include the ground signal Vg and the common signal Vcom. These transmitted signals can be replaced with the ground signal Vg, common signal Vcom, signal from other circuits of the substrate 100, the circuit module 300, or other signal sources and signals which can be easily identified.

Figure 11:
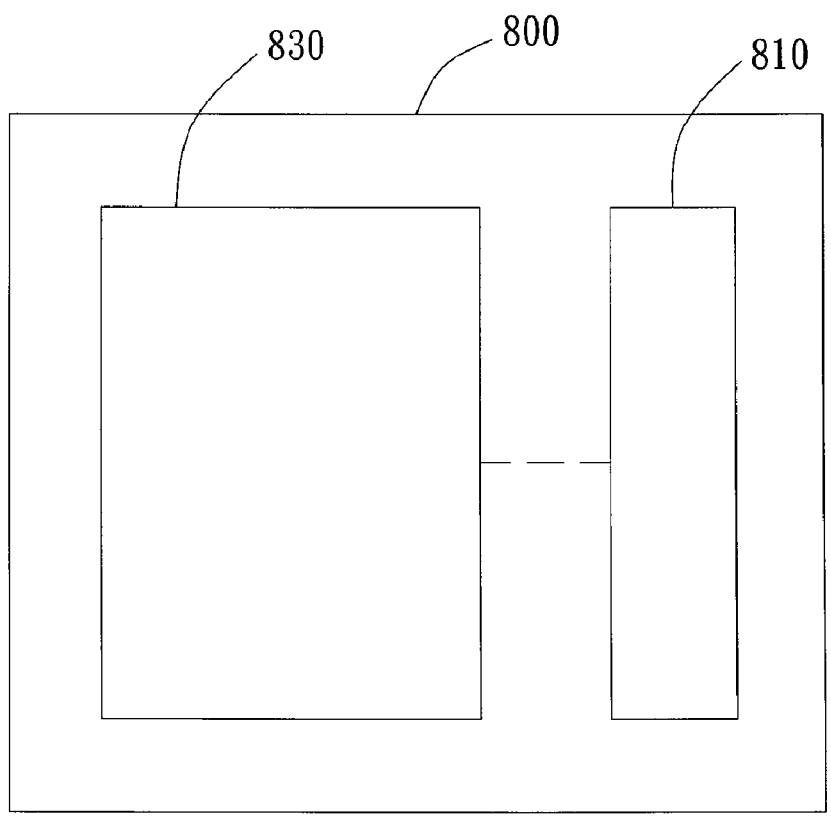
FIG. 11 is a perspective view of the present invention applied in a display panel and an electronic device.

The detection device and detection method of the present invention can be utilized in the display panel of LCD (Liquid Crystal Display), light emitted diode display panel (organic, inorganic or combinations thereof) or other types of display panels, as well as the circuit bonding condition of the above-mentioned panels. However, the present invention can also be used in the test of bonding condition of integrated circuits, the test in packaging of circuit board or the test of the circuit bonding condition of the electronic devices. Furthermore, as FIG. 11 shows, an electronic device 800 is consisting of a display panel 830 and an electronic component 810. The electronic component 810 includes a controller unit, an operation unit, a processing unit, an input unit, a memory unit, a driver unit, a light emitting unit, a protection unit, a sensor unit, a detection unit, units with other functions, or combinations thereof. The electronic device 800 includes portable products (such as watches, video cameras, cameras, notebooks computers, electronic photo frame, video game console, music player, electronic mail transceiver, position guiding system, or other similar products), multimedia product (such as video player, or other similar products), screen panel, television, indoor/outdoor billboard, or panel within a projector etc.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A circuit bonding detection device, comprising:
    a substrate having a plurality of contact pads disposed thereon, and the contact pads including a first group having at least one contact pad;
    a circuit module having a plurality of conductive bumps and disposed on the substrate, and the conductive bumps are corresponding to the contact pads;
    a set of sensors disposed on two sides of at least one of contact pads of the first group and the corresponding conductive bump; and
    a detection unit electrically coupled with the set of sensors, wherein the detection unit transmits a fault signal in response to at least one of the contact pads of the first group and the corresponding conductive bumps which deforms and contacts at least one sensor.

2. The circuit bonding detection device of claim 1, wherein the fault signal is a variation in a signal transmitted by at least one of the contact pads of the first group and the corresponding conductive bumps.

3. The circuit bonding detection device of claim 1, wherein at least one of the set of sensors includes a linear pattern, a rectangular pattern, or combinations thereof.

4. The circuit bonding detection device of claim 1, wherein the contact pads further include at least one second group has a plurality of contact pads, thus that the first group having at least one contact pad is located at an outside of the second group of the contact pads, between the second group of the contact pads, or combinations of the two above-mentioned locations.

5. The circuit bonding detection device of claim 1, wherein one of the set of sensors transmits a ground signal or a common signal.

6. The circuit bonding detection device of claim 5, wherein one of the set of sensors transmits a ground signal and other of the set of sensors transmits a common signal.

7. The circuit bonding detection device of claim 1, wherein a distance between one of the set of sensors and a lateral side of the contact pad of the first group is substantially equal to or substantially greater than 2 micrometers.

8. The circuit bonding detection device of claim 1, wherein when a deformation occurs, a change in lateral dimension of at least one of the contact pads of the first group and the corresponding conductive bumps is substantially equal to or substantially greater than 50 percent of at least one of the original lateral dimension of the contact pads of the first group and the corresponding conductive bumps.

9. A circuit bonding detection device, comprising:
    a substrate having a plurality of contact pads disposed thereon, and the contact pads including at least one first group having at least two contact pads;
    a circuit module disposed on the substrate, and including a plurality of conductive bumps corresponding to the contact pads;
    a set of sensors staggered correspondingly with at least one of the contact pads of the first group and the corresponding conductive bumps;
    a detection unit electrically coupling to the set of sensors, wherein the detection unit transmits a fault signal in response to at least one of the contact pads of the first group and the corresponding conductive bumps for deforming and contacting at least one sensor.

10. The circuit bonding detection device of claim 9, wherein the fault signal is a variation in the signal transmitted by at least one of the contact pads of the first group and the corresponding conductive bumps.

11. The circuit bonding detection device of claim 9, wherein at least one of the set of sensors includes a linear pattern, a rectangular pattern, or combinations thereof.

12. The circuit bonding detection device of claim 9, wherein the contact pads further include at least one second group having a plurality of contact pads, thus that the first group of at least one contact pad is located at an outside of the second group of the contact pads, between the second group of the contact pads, or combinations of the said above-mentioned locations.

13. The circuit bonding detection device of claim 9, wherein one of the set of sensors transmits a ground signal or a common signal.

14. The circuit bonding detection device of claim 9, wherein one of the set of sensors transmits a ground signal and the other sensor transmits a common signal.

15. The circuit bonding detection device of claim 9, wherein when a deformation occurs, a change in lateral dimension of at least one of the contact pads of the first group and the corresponding conductive bumps is substantially equal to or substantially greater than 50 percent of at least one of the original lateral dimension of the contact pads of the first group and the corresponding conductive bumps.

16. An electro-optical apparatus incorporating the circuit bonding detection device of claim 1.

17. An electro-optical apparatus incorporating the circuit bonding detection device of claim 11.

18. A detection method for the circuit bonding detection device, comprising:
  providing a circuit bonding detection device comprising:
    a substrate having a plurality of contact pads disposed thereon, and the contact pads including at least one first group having at least one contact pad;
    a circuit module having a plurality of conductive bumps and disposed on the substrate and the conductive bumps are corresponding to the contact pads;
    a set of sensors disposed on two sides of at least one of the contact pads of the first group and the corresponding conductive bumps; and
    a detection unit electrically coupled with the set of sensors;
  mounting the circuit module on the substrate and electrically coupling the contact pads of the substrate with the conductive bumps of the circuit module; and
  detecting the sensor to determine whether a deformation occurs in at least one contact pad of the first group of the substrate and the corresponding conductive bumps of the circuit module.

19. The detection method of claim 18, wherein the step of mounting the circuit module on the substrate includes aligning the contact pads of the substrate with the conductive bumps of the circuit module.

20. The detection method of claim 18, further including forming a bonding material between the substrate and the circuit module.

21. The detection method of claim 18, wherein the step of detecting the sensor includes transmitting a signal from the detection unit to at least one of the set of sensors and transmitting an another signal from the set of sensors to the detection unit, and determining whether the signal and the another signal are substantially equal.

22. The detection method of claim 21, wherein the signal includes a common signal, a ground signal, or combinations thereof.

23. A detection method for a circuit bonding detection device, the method comprising:
  providing a circuit bonding detection device comprising:
    a substrate having a substrate and a plurality of contact pads disposed on the substrate, and the contact pads including at least one first group having at least two contact pads;
    a circuit module including a plurality of conductive bumps and disposed on the substrate, and the conductive bumps are corresponding to the contact pads:
    a set of sensors staggered correspondingly with at least one of the contact pads of the first group and the corresponding conductive bumps ; and
    a detection unit electrically coupled to the set of sensors;
  mounting the circuit module on the substrate and electrically coupling the contact pads of the substrate with the conductive bumps of the circuit module; and
  detecting the sensor to determine whether a deformation occurs in at least one of contact pads of the first group of the substrate and the corresponding conductive bumps of the circuit module.

24. The detection method of claim 23, wherein the step of mounting the circuit module on the substrate includes aligning the contact pads of the substrate with the conductive bumps of the circuit module.

25. The detection method of claim 23, further comprising disposing a bonding material between the substrate and the circuit module.

26. The detection method of claim 23, wherein the step of detecting the sensor includes transmitting a signal from the detection unit to at least one of the set of sensors and transmitting an another signal from the set of sensors to the detection unit, and determine whether the another signal is substantially equal to the signal.

27. The detection method of claim 23, wherein the signal includes a common signal, a ground signal, or combinations thereof.

28. A detection method for electro-optical apparatus incorporating the detection method for a circuit bonding detection device of claim 18.

29. A detection method for electro-optical apparatus incorporating the detection method for a circuit bonding detection device of claim 23.

* * * * *